(12) United States Patent
Brown (10) Patent No.: US 6,222,198 B1
(45) Date of Patent: Apr. 24, 2001

(54) SYSTEM AND METHOD FOR ALIGNING PATTERN AREAS ON OPPOSING SUBSTRATE SURFACES

(75) Inventor: Daniel M. Brown, Madison, AL (US)

(73) Assignee: MEMS Optical Inc., Huntsville, AL (US)

( * ) Notice: Subject to any disclaimer, the term of this patent is extended or adjusted under 35 U.S.C. 154(b) by 0 days.

(21) Appl. No.: 09/196,784

(22) Filed: Nov. 20, 1998

(51) Int. Cl.$^7$ .................................................. G01B 11/00
(52) U.S. Cl. .............................. 250/548; 356/399; 355/53
(58) Field of Search .................... 250/548; 356/399, 356/400, 401; 355/53

(56) References Cited

U.S. PATENT DOCUMENTS

| | | |
|---|---|---|
| 4,650,983 | 3/1987 | Suwa . |
| 5,464,715 | 11/1995 | Nishi et al. . |
| 5,572,288 | * 11/1996 | Mizutani ............................. 250/548 |

* cited by examiner

Primary Examiner—John R. Lee
Assistant Examiner—Kevin Pyo
(74) Attorney, Agent, or Firm—Birch, Stewart, Kolasch & Birch, LLP (57) ABSTRACT

A system and method for achieving alignment of a mask and substrate focuses a first image (e.g., a reticle) on a first position of a first substrate surface, and determines whether the first position is aligned with a second position on an opposing second substrate surface based on a second image formed based on light from a micro-optical device located on the second surface which collects light from a first image focused thereon. To determine whether the first and second positions are aligned, the first image and the second image are projected on an image plane and compared, the first and second positions being aligned when the first image and the second image are coincident on the image plane. A mask and/or alignment pattern may be formed on the opposing substrate surfaces, and used to generate aligned optics on those surfaces. As such, precise alignment between optics on opposing surfaces of a substrate can be achieved. In this system, the secondary image may or may not be an exact replica of the first reticle image, depending upon the type of micro-optical device used.

27 Claims, 10 Drawing Sheets

SYSTEM AND METHOD FOR ALIGNING PATTERN AREAS ON OPPOSING SUBSTRATE SURFACES

BACKGROUND OF THE INVENTION

1. Field of the Invention

The present invention relates to a system and method for achieving top-to-bottom mask alignment. More particularly, the present invention relates to a system and method for aligning pattern areas on a photoresist-coated substrate surface having pattern areas on the opposite surface of the substrate. The alignment performed by the present invention is preferably based on a reticle image that is formed on the photoresist and reflected from the opposite surface by a micro-optical device installed on that opposite surface.

2. Description of the Related Art

Photolithographic technology involves the process of transferring a pattern on a mask into a photosensitive photoresist coated onto a substrate. The mask is usually a quartz or glass plate with one side coated with a thin opaque chrome layer. To form a desired pattern on the mask, portions of the chrome layer are precisely removed to form a complex pattern of transparent and opaque areas. In the microelectronics industry, this pattern represents a microcircuit. In the micro-optics industry, this pattern represents an optical device such as a lens or diffraction grating. The goal of photolithography is to precisely transfer the mask pattern into the photoresist which is coated onto the substrate. The two categories of photolithography generally used in conventional practice are projection lithography and contact lithography. Projection lithography involves the use of a lens to image the mask pattern onto the surface of the photoresist. Devices used to achieve projection lithography are called steppers. Contact lithography involves direct contact between the mask and the photoresist. Devices used to achieve contact lithography are called mask aligners. This invention is related to the latter category of contact lithography.

Once the photoresist on the substrate has been properly exposed to UV light transmitted through the mask pattern, the substrate is removed from the stepper or mask aligner and the photoresist is chemically developed. Areas of photoresist not exposed to UV light remain on the substrate. By contrast, areas of photoresist exposed to UV light are removed by the chemical developer, leaving the substrate susceptible to subsequent ion etching in those areas. After developing the photoresist, the substrate is placed in a reactive ion etcher which bombards the surface with reactive gas ions. The ions etch the unprotected areas of the substrate and thus transfer the photoresist pattern into the substrate. After etching to the correct etch depth (usually less than a few microns), the substrate is removed from the etcher and all remaining photoresist is chemically removed.

Optical devices fabricated using photolithographic technology often require precise alignment of devices on both sides of a single substrate. For instance, it is sometimes necessary to etch optical lenslets, alignment marks, detectors or other devices into both sides of a thick (several millimeter) substrate, and to obtain a precise lateral arrangement of devices positioned on one side of the substrate with corresponding devices positioned on the opposite side of the substrate. Such precise alignment is difficult to achieve, particularly when the substrate is too thick for the mask aligner microscope or the substrate is opaque to visible light.

To enable alignment of devices on opposing sides of a substrate which only transmits invisible infrared light (e.g. silicon or germanium substrates), a conventional mask aligner may be equipped with an infrared source and camera. The infrared source and camera enable the user to "see" through the substrate and alternatingly focus on the alignment marks positioned on both sides of the substrate by translating the microscope perpendicular to the substrate surface. However, to focus the microscope on the distal surface of the substrate, the working distance of the microscope objective must be greater than the thickness of the substrate and mask plate combined.

Figure 1A:
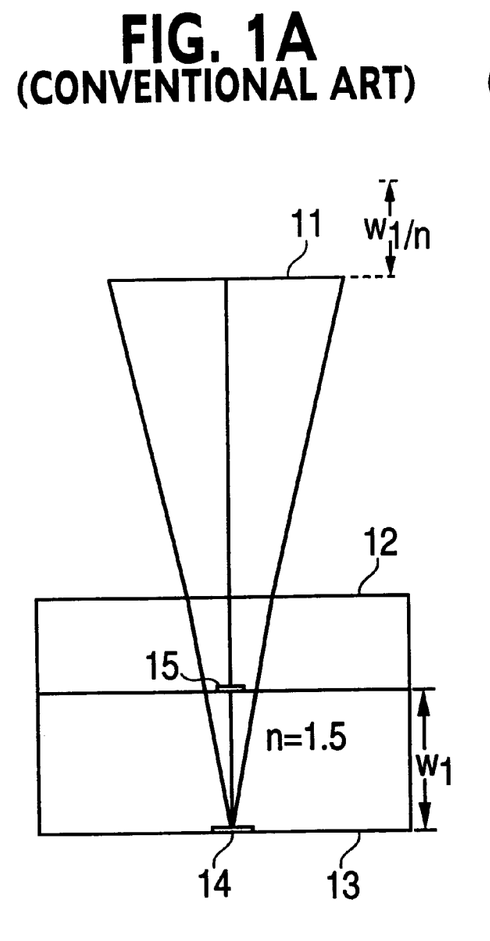
FIGS. 1A–1B illustrate the operation of a conventional mask aligner.
Figure 1B:
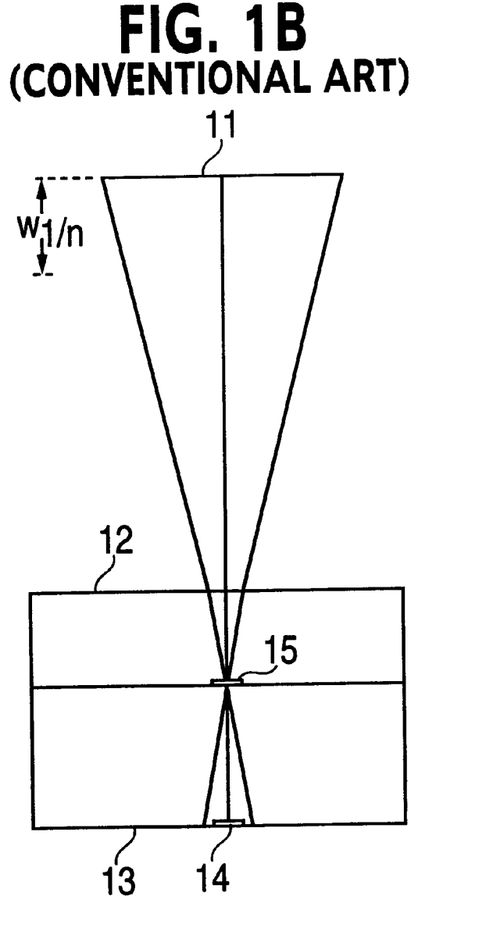

FIGS. 1A–1B illustrate how a conventional mask aligner (either visible or infrared) is used to align devices on opposite sides of a substrate, FIG. 1A showing the mask aligner focused on the distal (lower) substrate surface and FIG. 1B showing focus on the proximate (upper) substrate surface. More specifically, the microscope objective 11 of the mask aligner is positioned above the mask 12 and substrate 13. The mask pattern 15 is positioned on the lower surface of the mask and in contact with the photoresist coated on top of substrate 13. An alignment mark 14 has been previously etched into the lower surface of a substrate.

The mask aligner is designed to align an alignment mark 15 of mask 12 with the alignment mark 14 positioned on the lower opposing surface of substrate 13, so that the mask e(Y. pattern can be transferred into the photoresist on the top surface of substrate 13. To achieve alignment, the microscope objective 11 of the mask aligner is alternatingly focused on the top and bottom alignment marks 14 and 15 by translating the microscope objective 11 perpendicular to the surface of substrate 13.

The distance that the microscope objective must be translated is equivalent to the thickness W1 of the substrate 13 divided by the index of refraction n of the substrate 13 (e.g., n=1.5). For instance, the microscope is first centered on the lower alignment mark 14, often with the aid of a reticle or cross hair in the eyepiece of the microscope. The microscope is then vertically translated to focus on the top or photoresist surface of the substrate, where the mask is moved laterally to center its alignment mark in the field of view of the microscope. After exposing and developing the photoresist, the substrate is etched to transfer the pattern from the photoresist into the surface of the substrate.

To achieve accurate top-to-bottom alignment using a conventional mask aligner, as described, the microscope must be precisely translated in a direction perpendicular to the surfaces of the substrate. If the microscope is not translated perpendicular to the surfaces, a lateral change in position of the microscope will result, causing the two patterns on the opposite surfaces to be misaligned.

However, conventional mask aligners are not generally designed for precise perpendicular translation of the microscope body. Rather, the normal wobble and straightness of travel tolerances in mask aligner microscope translation stages is large enough to introduce several microns of lateral error in the alignment. In fact, recent experiments using a state-of-the-art conventional mask aligner showed more than twenty (20) microns of lateral alignment error between the patterns placed on opposite surfaces of a typical substrate. Consequently, conventional mask aligners of this type are susceptible to error.

Another conventional system used to achieve front-to-back alignment involves two video cameras used to focus upon the alignment marks positioned on opposite sides of the substrate, the two images from the cameras being superimposed electronically to show lateral alignment of the two marks. However, use of this system to align substrates of different thicknesses is limited, since the system must be calibrated for a fixed substrate thickness using a calibration plate which has alignment marks precisely placed on both sides of the plate by the manufacturer of the mask aligner.

SUMMARY OF THE INVENTION

The present invention is directed to an apparatus and method that substantially obviates one or more of the problems experienced due to the above and other limitations and disadvantages of the conventional art.

An object of the present invention is to provide a method and system for precisely aligning corresponding patterns on opposite surfaces of a substrate, including alignment marks or other devices located in those pattern areas. Other and further objects, features, and advantages of the present invention will be set forth in the description that follows, and in part will become apparent from the detailed description, or may be learned from the practice of this invention.

To achieve these and other objects, features, and advantages in accordance with the purpose of the present invention as embodied and broadly described, the present invention includes a system and method for detecting lateral alignment between a mask pattern focused on the top surface of a thick substrate and a pattern installed on the bottom surface of the substrate, a system and method for forming marks on one side of a substrate in alignment with marks on the opposite side of the same substrate, and a system and method for achieving precise positioning of micro-optical, micro-electronic, or micro-mechanical devices (hereinafter called "micro-devices") on the two opposite sides of a single substrate.

To detect lateral alignment of patterns between opposite sides of a substrate, the present invention includes a system and method for focusing a reticle image on the photoresist-coated surface of a substrate, and determining whether this reticle image is aligned with a position on the opposite surface of the substrate by examining a second image of the reticle produced near the first image by an optical imaging device located on the opposite or bottom surface of the substrate. The optical device may be a concave mirror, a reflective diffractive optical element, or a complex diffraction grating. The reflected second image of the reticle replicate or closely correspond to the first reticle image or it may be substantially different. Both images are formed on the top surface of the substrate, thus eliminating the need to translate the microscope or alternately refocus the microscope on the two surfaces of the substrate. Alignment is detected when both images coincide.

More specifically, the microscope reticle focused on the top surface of the substrate is laterally aligned with the optical axis of a micro-optical device located on the bottom surface when a second image of the reticle produced by this optical device is observed to be in coincidence with the first image produced by the microscope. A pattern on the mask can then be brought into coincidence with these two superimposed images. When this is achieved, the pattern on the mask is laterally aligned to a pattern on the lower surface of the substrate. Repeating this process for at least two separated points on the mask will remove rotational misalignment as well. Upon aligning the mask both laterally and rotationally, the mask can be exposed with UV light, as usual, to transfer the pattern into the photoresist on the substrate.

Both the foregoing general description and following detailed description are exemplary and explanatory and are intended to provide further explanation of the invention as claimed. Thus, it should be understood that the detailed description and specific examples, while indicating preferred embodiments of the present invention are given by way of example only, since various changes and modifications that are within the spirit and scope of the invention will become apparent to those of ordinary skill in the art from this detailed description.

BRIEF DESCRIPTION OF THE DRAWINGS

The present invention will become more fully understood from the detailed description below along with the drawings, which are given by way of illustration and thus do not limit the actual implementation of the present invention, wherein.

DETAILED DESCRIPTION OF THE PREFERRED EMBODIMENTS

Reference will now be made in detail to the preferred embodiments of the present invention, examples of which are illustrated in the accompanying drawings. In the drawings, redundant description of like elements and processes, which generally are designated with like reference numerals, is omitted for brevity.

Before describing the processes used to align the substrate and mask, detailed descriptions of the mask aligner, the substrate, and the mask are provided.

The Mask Aligner

Figure 2A:
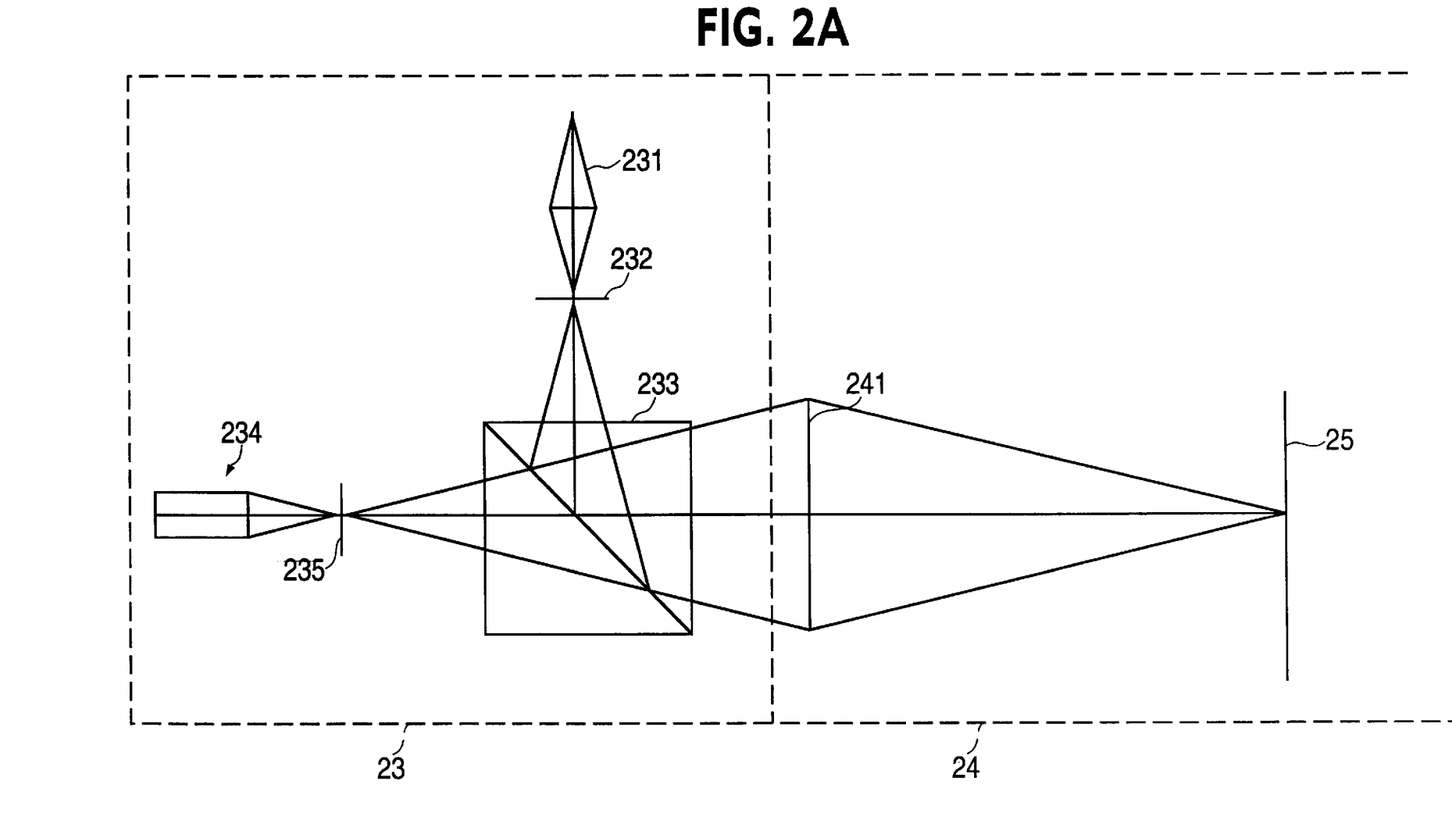
FIGS. 2A–2C illustrate a mask aligner according to a first embodiment of the present invention, and show the relationship of that mask aligner to a mask and a substrate having opposing surfaces on which alignment marks will be aligned.
Figure 2B:
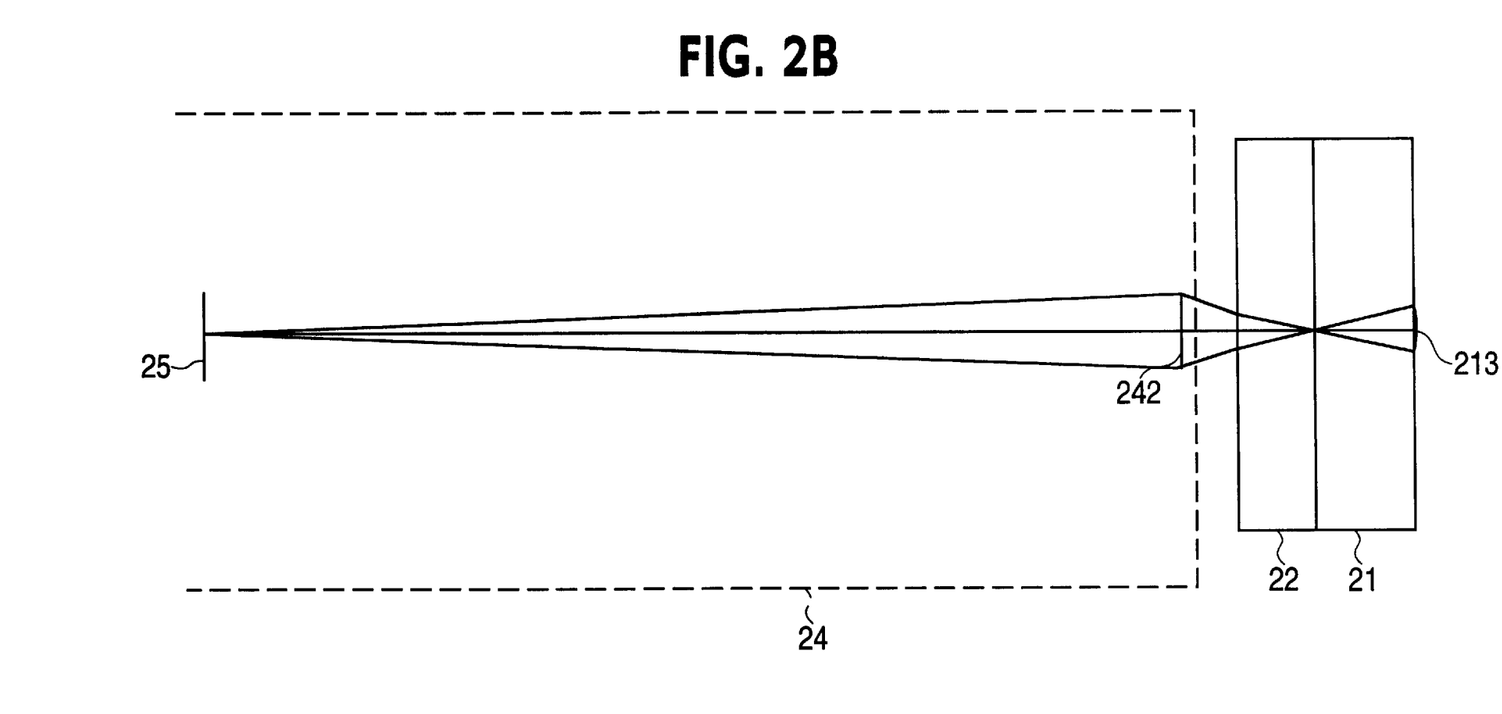

FIGS. 2A–2B illustrate an exemplary mask aligner in accordance with a first embodiment of the present invention. The mask aligner of FIGS. 2A–2B includes a projection eyepiece 23 and a microscope body 24. The projection eyepiece 23 shown in FIGS. 2A–2B is similar to that typically used in autocollimation telescopes. However, an improved embodiment of the projection eyepiece, such as described later with respect to FIG. 6, may be used in place of the projection eyepiece shown by FIG. 2A.

The projection eyepiece 23 contains a visible or infrared source 231 which illuminates a source reticle 232. An image of the source reticle 232 is projected down the microscope body 24 by beam splitter 233 and relay lens 241. Detection device 234 is typically either a visible or infrared camera focused on reticle 235. However, detection device 234 may be a conventional microscope eyepiece for human visual operation.

In the projection eyepiece 23, reticles 232 and 235 are aligned with respect to each other such that their positions are mirror images of each other about the reflecting plane of beam splitter 233. In other words, if an observer were to look back into the eyepiece from the right (e.g. from position 241), the observer would observe the two reticles 232 and 235 superimposed on top of each other. Image plane 25 is therefore simultaneously a conjugate image plane of both reticles 232 and 235.

Microscope body 24 includes an arrangement of lenses, including a microscope objective 242 arranged to produce an image of the mask pattern (located at the interface between mask 22 and substrate 21) onto the image plane 25. Together with the projection eyepiece 23, the microscope body 24 also focuses light from source reticle 232 and forms an image of the source reticle 232 onto the photoresist-coated surface of substrate 21, which is also located at the interface of mask 22 and substrate 21. The four conjugate image-object planes of the system include; reticles 232 and 235, image plane 25, and the interface between mask 22 and substrate 21.

Generally, image plane 25 of microscope objective 242 is located inside the microscope body 24. For proper operation, the reticles 232 and 235 must be coincident with image plane 25, but the beam splitter 233 may prevent physical location of the reticles at image plane 25. In such a case, a relay lens 241 is preferably included as an attachment to the microscope body 24 (as shown) to reimage the reticles onto image plane 25 of microscope objective 242 with the proper magnification. The light returned from the substrate 21 produces an image at image plane 25 before being reimaged by relay lens 241 onto reticle 235. The displacement between the image formed at reticle 235 and the actual reticle 235 is used to determine alignment between the mask 22 and substrate 21.

The relay lens 241 may alternatively be included in the projection eyepiece 23 (not shown). Also, relay lens 241 can serve to remove aberrations produced by focusing light through beam splitter 233 if beam splitter 233 is a cube beam splitter.

In the preferred embodiment, the distance between lenses 241 and 242, as well as the specific optical power of relay lens 241, is defined by the specific optical and mechanical configuration of the mask aligner and the required magnification at camera 234. The specific optical prescription may therefore be determined by routine lens design or experimentation. Image plane 25 is generally located at a position corresponding to a reticle or cross hair in the conventional eyepiece of a microscope or mask aligner. Furthermore, the substrate 21 and mask 22 may be positioned precisely with respect to the microscope lens using well-established conventional means, such as those customarily used on conventional mask aligners.

Figure 5:
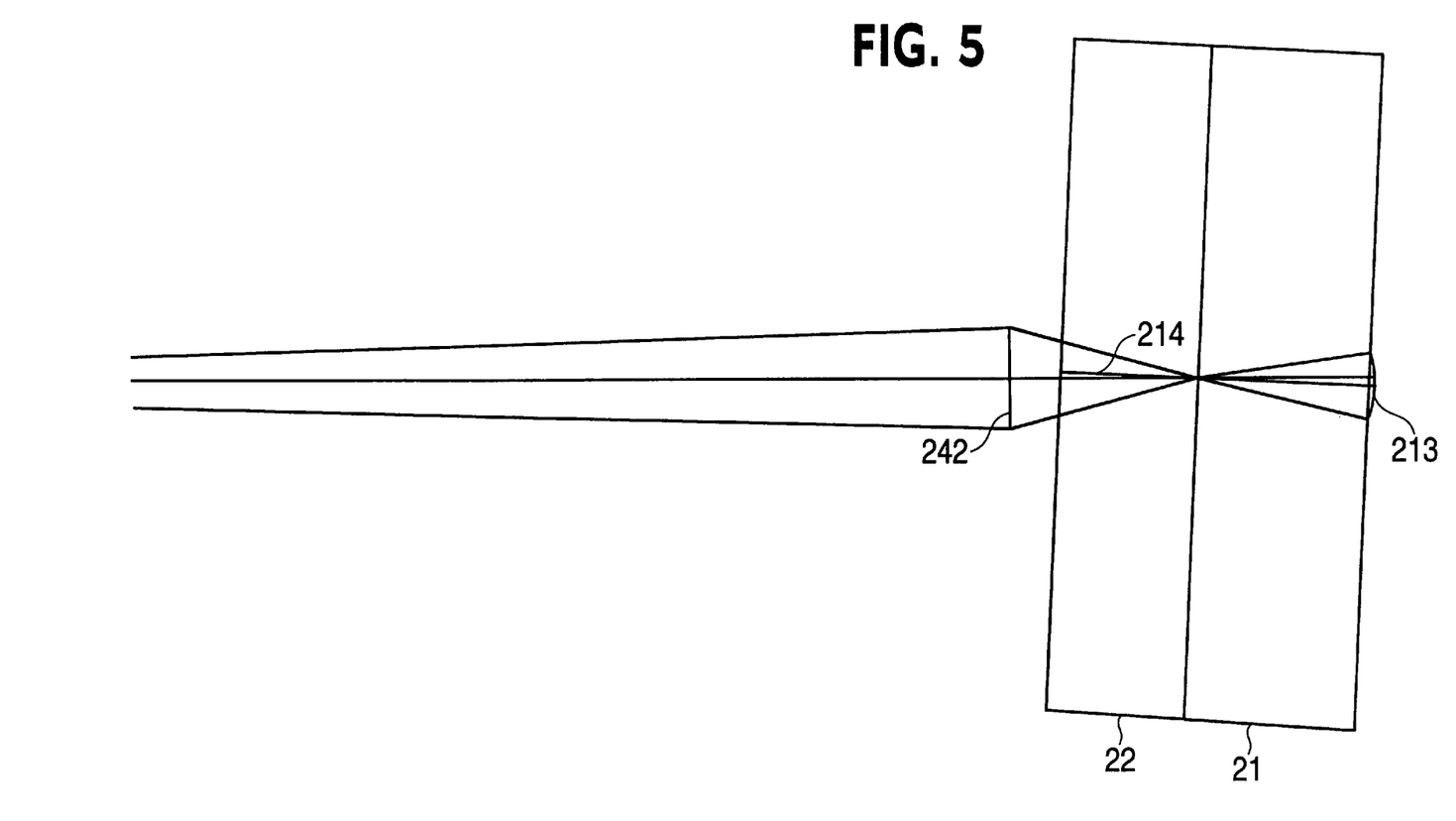
FIG. 5 illustrates the inconsequential effects of a substrate whose surfaces are inclined with respect to the microscope of the mask aligner using this invention.

Thus, in the preferred embodiment, this invention requires only that the existing eyepiece or camera from the mask aligner be replaced with the projection eyepiece of FIG. 2A or FIG. 5. By adopting the unique design of the above-described projection eyepiece and by including specific optical devices on the substrate, existing commercial mask aligners can be modified to implement this invention.

The Substrate

Figure 2C:
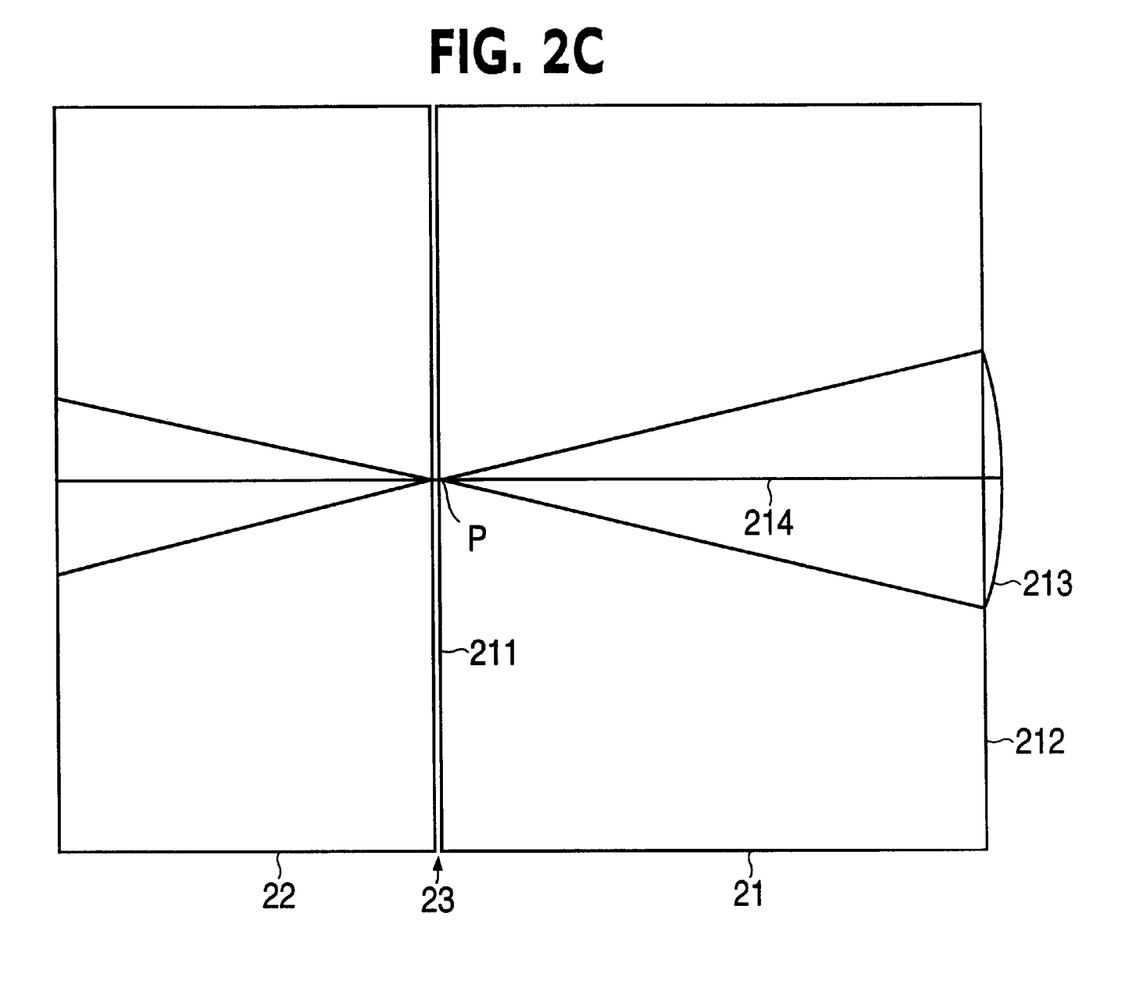

The substrate is identified in FIGS. 2B and 2C by reference numeral 21. Substrate 21 is fabricated from a material that is transparent to the light used to project the reticle image onto the substrate. If the substrate is transmissive to infrared light but not visible light, such as silicon or germanium, then an infrared source and camera are used in the projection eyepiece. By contrast, for substrates which transmit visible light, such as fused silica, gallium phosphide or zinc selenide, a visible source and camera (or microscope eyepiece) are used in the projection eyepiece. Various other materials may also be used for the substrate, so long as they are optically transparent to either visible light or infrared light.

Substrate 21 has a first substrate surface 211 and an opposing second substrate surface 212. First substrate surface 211 is coated with photoresist 23 which contacts mask 22. The mask pattern lies on the surface of mask 22 that contacts the photoresist 23. The photoresist layer 23 between the mask pattern of mask 22 and first substrate surface of 211 ranges in thickness from less than one micron to several microns, depending on the application or device to be transferred into the substrate. At least one alignment mark and at least one reflective micro-optical device 213 (hereinafter a "micro-mirror") are fabricated onto the second substrate surface 212. Generally, more than one alignment mark and one micro-mirror are used in order to remove both rotational and translational alignment errors. Alignment marks may be positioned anywhere on the second substrate surface 212, but the position of the alignment marks must be precisely known relative to the position of the micro-mirrors 213 in order for the alignment marks to be used for subsequently fabricating micro-devices on the second substrate surface 212. Alternatively, if the micro-devices and the micro-mirrors 213 are simultaneously fabricated on surface 212 using the same mask so that no further processing on surface 212 is required, then additional alignment marks other than the micro-mirrors 213 would not be necessary on surface 212.

Micro-mirrors 213 are used to establish reference positions on the first substrate surface 211 that are precisely positioned with respect to reference positions on the second substrate surface 212. In the simplest embodiment, each micro-mirror 213 is a concave mirror with a radius of curvature equal to the thickness of the substrate 21 and with an optical axis 214 which is perpendicular to the surface of the substrate 21, as illustrated in FIG. 2C. In this embodiment, point P, which lies on the optical axis 214, is simultaneously a conjugate object and image point, and surface 211 is simultaneously a conjugate object and image plane. Therefore, in this embodiment, a point of light focused to the left of P on surface 211 will be imaged to the right of P on surface 211, and vice versa. Alternate embodiments include micro-mirrors 213 formed of reflective diffractive optical elements, diffraction gratings, or a complex holographic optical elements. However, in each of these embodiments, the micro-mirror 213 collects light from an image formed on the first substrate surface 211 near its optical axis 214, and focuses the light to form a second image on the first substrate surface 211. Thus, the micro-mirrors 213 are sensitive to the lateral position of the first image formed on the first substrate surface 211, such that a first image that is centered on the optical axis of the micro-mirror 213 will coincide with its reflected second image from the micro-mirror 213. Otherwise, when a first image is not centered on the optical axis of micro-mirror 213, a detectable lateral displacement will be observed between the first image and its reflected second image.

There are a number of different methods for fabricating the micro-mirrors and alignment marks on the second substrate surface 212, most all of which use some form of photolithography. The micro-mirrors 213 may be etched into the surface of the substrate 21, or they may be fabricated in a thin film or coating on the second substrate surface 212. Some of the methods for fabricating micro-optical devices are discussed in *Micro-optics and Lithography*, Maria and Stefan Kufner, VUB University Press, Brussels, Belgium, 1997.

The Mask

The mask is identified in FIGS. 2B and 2C by reference numeral 22. Mask 22 is preferably a gray scale mask which is capable of achieving one-step fabrication of the micro-optical device. However, other conventional masks such as chrome masks may be used. Mask 22 is placed in contact with the photoresist-coated substrate 21. The side of mask 22 in contact with the photoresist 23 contains the mask pattern to be transferred into the photoresist 23. The mask pattern contains alignment marks which are to be centered on the optical axes of the micro-mirrors 213. The mask aligner has devices, such as a micrometer adjustment, to precisely translate the mask 22 laterally with respect to the substrate 21. In addition to the alignment marks for centering the optical axes of the micro-mirrors 213, the mask 22 may contain patterns for other micro-devices, including additional alignment marks for subsequent fabrication processes.

Process for Aligning the Substrate and the Mask

Figure 3A:
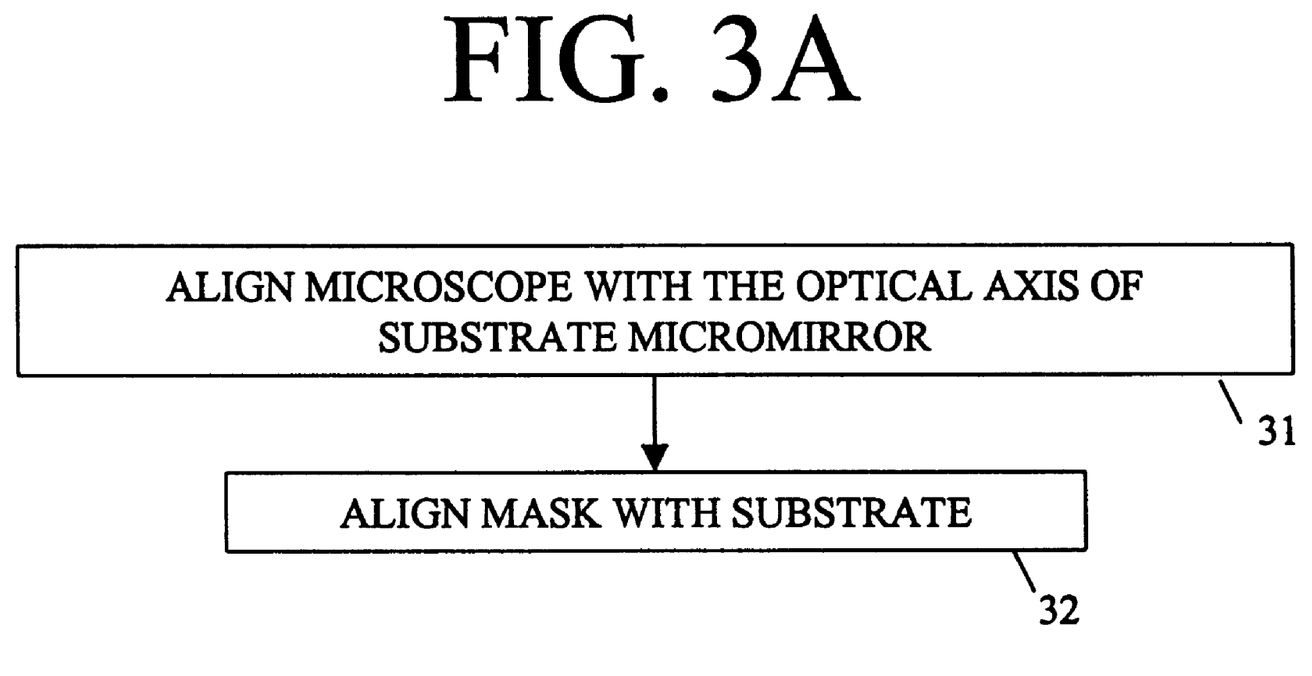
FIGS. 3A–3C illustrate steps of an examplary process used to align a substrate and mask according to the present invention.
Figure 3B:
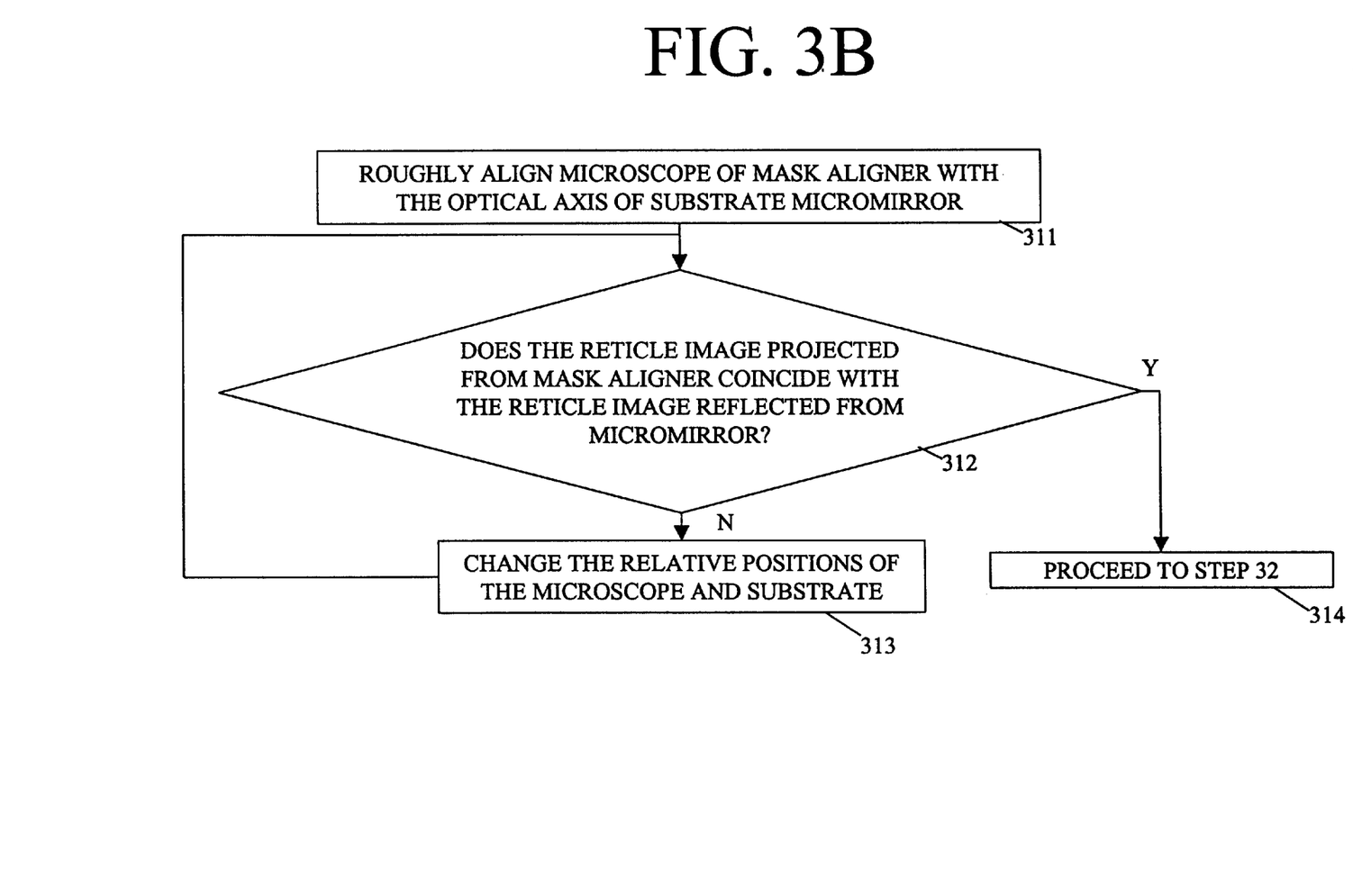
Figure 3C:
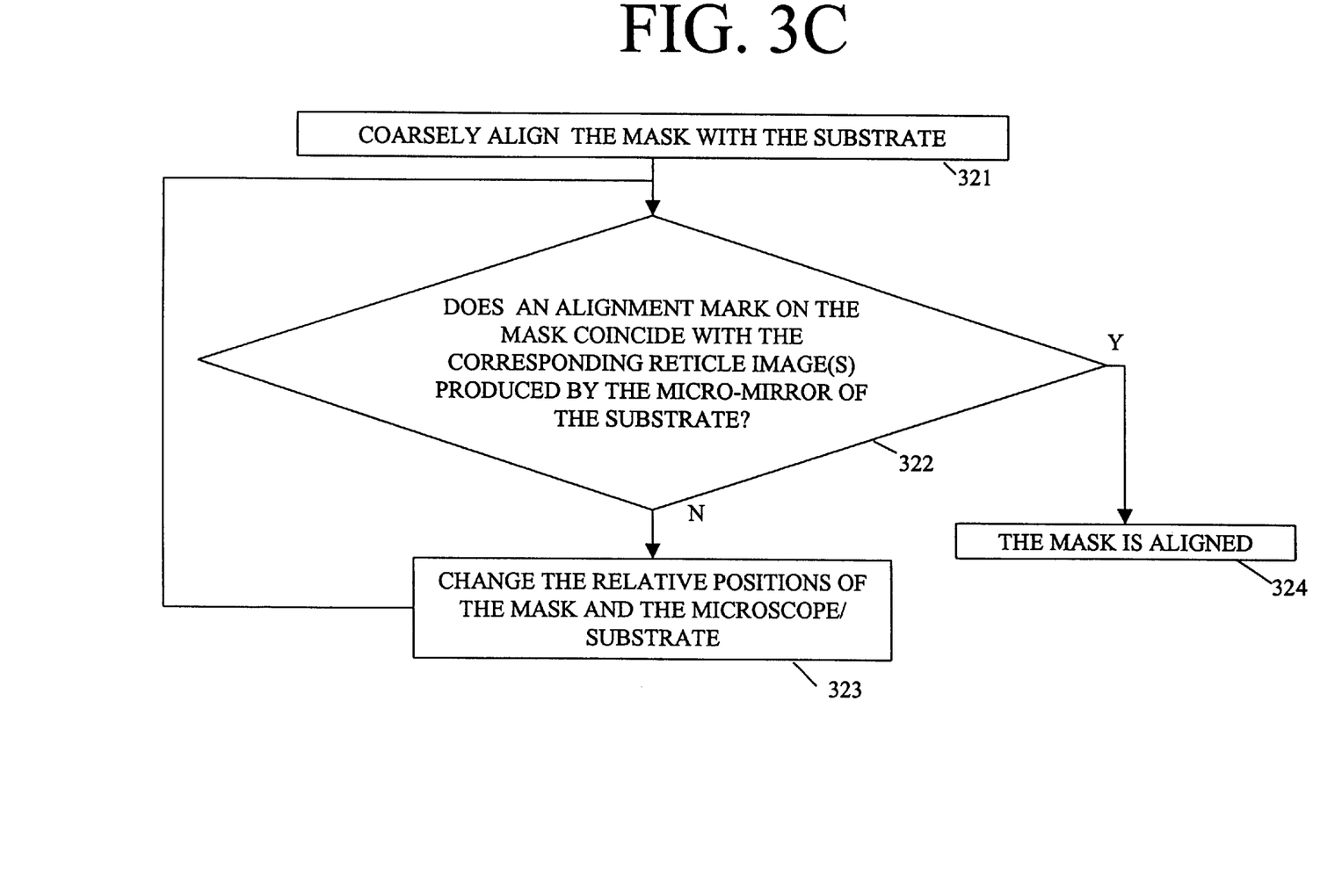

The flowcharts of FIGS. 3A–3C show steps in an examplary process used to align a substrate and mask using a mask aligner having the above-described mask, substrate, and projection eyepiece. In step 31 of FIG. 3A, the cross hair or reticle of the mask aligner microscope is aligned with the optical axis of one of the micro-mirror devices positioned on the distal substrate surface. In this step, the relative positions of the microscope and substrate are changed until coincidence is achieved between the two images of the reticle at image plane 25, indicating alignment of the microscope with the optical axis of the target micro-mirror device on the substrate. Once the microscope is aligned with the optical axis of the micro-mirror device, an alignment mark on the mask is brought into coincidence with the microscope reticle in step 32, thereby aligning the mask with the substrate.

More specifically, FIG. 3B shows steps in an examplary process for aligning the microscope with the optical axis of a substrate micro-mirror according to step 311 of FIG. 3A, and FIG. 3B shows steps in an examplary process for aligning the mask with the substrate according to step 32 of FIG. 3A. The mask holder and substrate chuck on most all commercial mask aligners are generally able to roughly align the mask with the substrate within a tolerance of better than 1 mm. Therefore, the optical axis of the micro-mirrors will be within the vicinity (<1 mm) of the corresponding alignment marks on the mask, which are easily found under low power magnification of the microscope. If the substrate is thin enough, the user will also see a blurred outline of the micro-mirror which can be used to help align the microscope on the optical axis of the micro-mirror device. The rough alignment achieved by this method is generally sufficient to detect reflected light from the micro-mirror.

In step 311 of FIG. 3B, the microscope of the mask aligner is roughly aligned with the micro-mirror of the substrate. In step 312, the reticle image projected from the mask aligner is compared with the reticle image reflected from the micro-mirror on image plane 25. If the images coincide, the microscope is deemed to be aligned with the optical axis of the substrate micro-mirror, and the process proceeds to step 32 for alignment of the mask with the substrate. By contrast, if the images do not coincide, the relative positions of the microscope and substrate are changed in step 313, and the process is returned to step 312 for an updated comparison of the images. Micrometer or micropositioner devices are generally used to change the relative positions of the microscope or the substrate chuck.

In step 321 of FIG. 3C, the mask is coarsely aligned with the substrate. The image of an alignment mark on the mask is then compared with the coincident images produced by the micro-mirror of the substrate in step 322. If the alignment marks and coincident reticle images are determined to coincide in step 322, the mask and substrate are deemed aligned in step 324. However, if the alignment marks are not determined to coincide in step 322, the relative positions of the mask and microscope/substrate are changed in step 323, and the process is returned to step 322 to perform an updated comparison of the alignment marks.

The processes described with respect to FIGS. 3A–3C can be repeated for at least two widely separated micro-mirrors on the substrate in order to remove both translational and rotational errors between the mask and substrate.

Figure 4A:
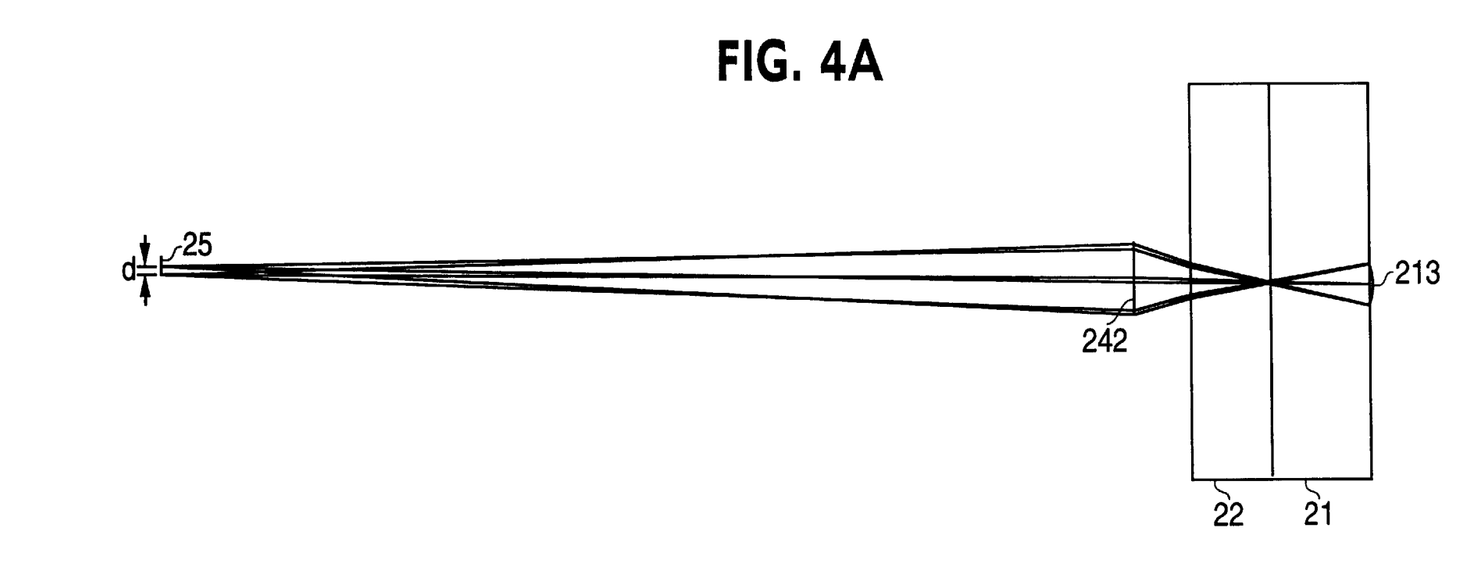
FIGS. 4A–4B illustrate the lateral displacement between the two images of the reticle due to misalignment between the patterns on opposite sides of the substrate.
Figure 4B:
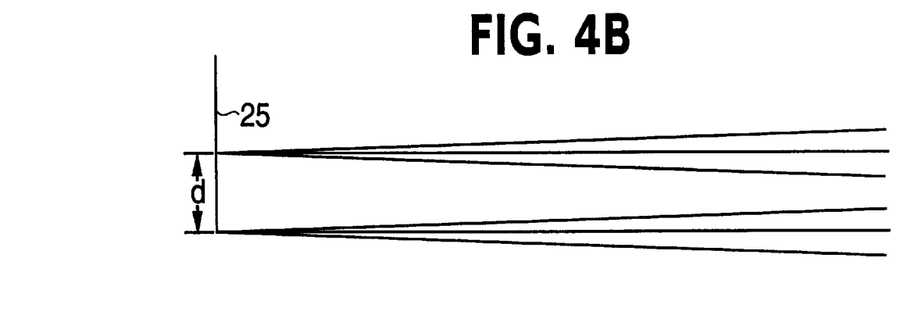

FIGS. 4A–4B illustrate the lateral displacement (d) of the two images at image plane 25 when microscope objective 242 is not aligned with the optical axis of micro-mirror 213. The magnitude of the displacement is equal to twice the alignment error times the magnification of the objective. Thus, using a 40× microscope objective, a 5-micron alignment error will result in a 400-micron displacement between the two reticle images.

Unlike the conventional top-to-bottom alignment method of vertically translating the microscope to alternately focus on opposite surfaces of the substrate, the above-described process is relatively stable, even when tilt is experienced between the substrate and microscope. FIG. 5 illustrates an example of a substrate and mask tilted with respect to the microscope, where the degree of the tilt is exaggerated for clarity.

In FIG. 5, microscope objective 242 is focused on the optical axis 214 of the micro-mirror 213 at the conjugate object and image planes of the micro-mirror (located at the interface between mask 22 and substrate 21). As shown, no displacement occurs between the two images at image plane 25 and no misalignment is detected as a result of the tilt. From this example, one of ordinary skill will appreciate that the system's capability to perform the top-to-bottom alignment is not affected by the perpendicularity of the microscope with respect to the substrate surface. Rather, alignment can be successfully achieved by the present invention so long as the microscope objective is focused on the optical axis of the micro-mirror at the conjugate object and image planes of the micro-mirror.

Improved Projection Eyepiece

The standard projection eyepiece of FIG. 2A requires reticle 232 to be aligned with reticle 235. If the two reticles are not optically superimposed at the projection eyepiece, their images will not overlap at image plane 25 when true alignment is realized causing a systematic mask alignment error. However, it is difficult to attain this alignment, and even more difficult to maintain this alignment with normal handling and wear. The improved projection eyepiece of FIG. 6 alleviates the need for precise alignment by using the same reticle for both the source and image comparison reticles. Since one physical reticle is used to produce both the source and image comparison reticles, alignment of multiple reticles is not necessary to achieve optical overlap.

Figure 6:
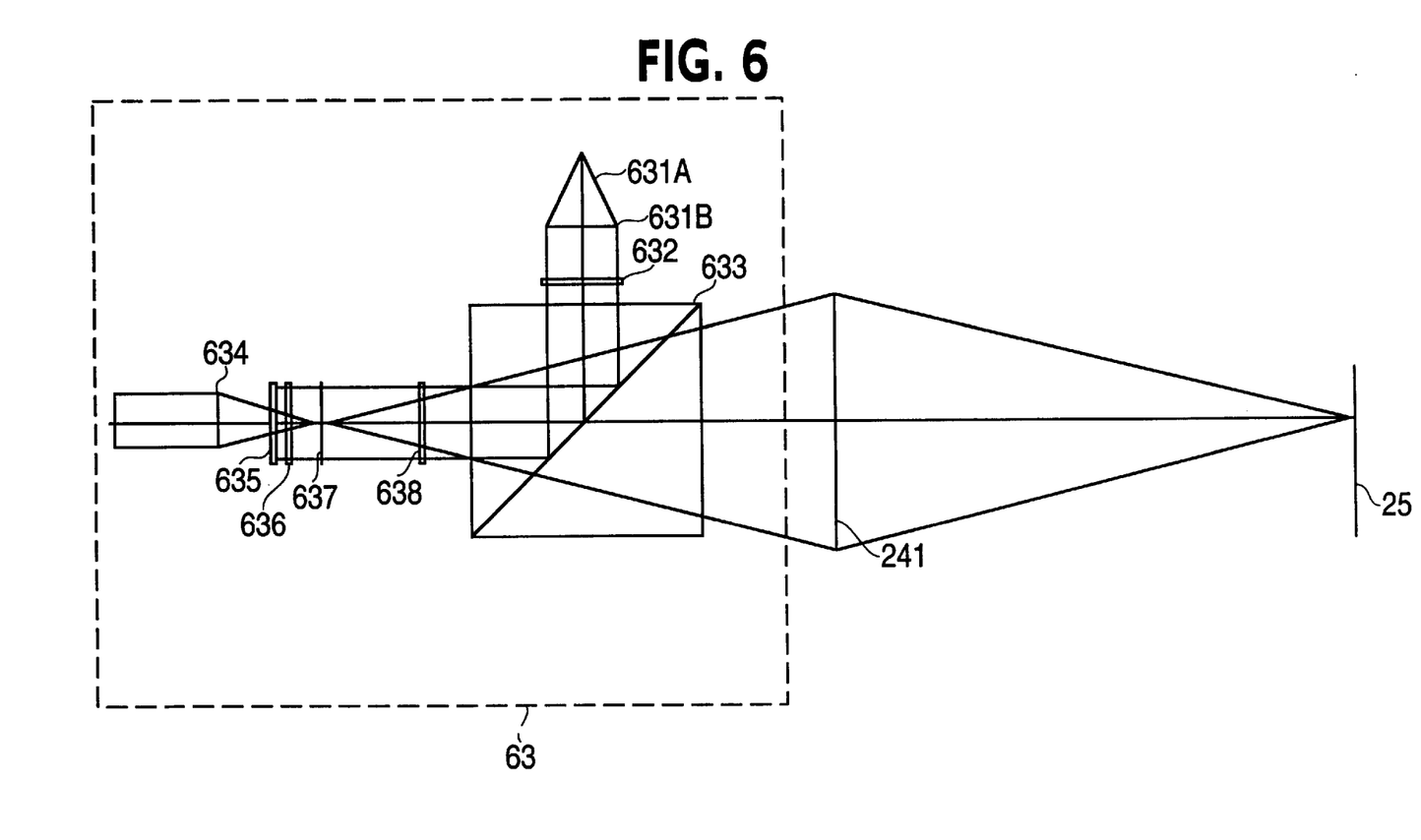
FIG. 6 illustrates an improved projection eyepiece suitable for use with this invention.

The projection eyepiece of FIG. 6 consists of the following components: a visible or infrared source 631A, source collimating lens 631B, linear polarizer 632, polarization sensitive cube beam splitter 633, quarter wave plate 638, reflective reticle 637, quarter wave plate 636, linear polarizer 635, and camera or eyepiece lens 634. As in FIG. 2A, the projection eyepiece may include a relay lens 241 for the same reasons as discussed earlier. The polarization beam splitter 633 causes s-polarized light to be reflected at the reflecting interface and p-polarized light to be transmitted through it. The linear polarizer 632 is oriented to produce s-polarized light incident on the polarization cube beam splitter 633. The source light from source 631A, which passes through source collimating lens 631B and linear polarizer 632, is reflected off the interface of beam splitter 633 toward quarter wave plate 638. Quarter wave plate 638 is oriented 45 degrees with respect to the polarization direction so that the light becomes circularly polarized upon transmission therethrough. Reticle 637 consists of a reflective, metallic cross hair or other reflective reticle pattern with clear surrounding regions, e.g., produced by photolithography and chemical etching. Some of the source light reflects off the metallic regions of the reticle and makes a second pass through quarter wave plate 638, whereupon the reflected light becomes p-polarized light with respect to the beam splitter 633. This p-polarized light, which appears to be emanating from reticle 637, passes through the beam splitter and is imaged by relay lens 241 onto image plane 25. The circularly polarized source light, which is not reflected at reticle 637, passes through quarter wave plate 636 where it is converted into p-polarized light. Linear polarizer 635 is oriented to block p-polarized light, preventing this extraneous light from reaching the camera or eyelens 634.

The p-polarized light projected down the microscope body by relay lens 241 is imaged onto the substrate as described previously. When this light is reflected from the substrate, it remains p-polarized. The p-polarized light reflected from the micro-mirrors (not shown in this figure, but shown as 213 in FIG. 2C) again passes through the cube beam splitter 633, through quarter wave plate 638, where it is converted to circularly polarized light. The light then passes through the second quarter wave plate 636, where it is converted into s-polarized light which passes through linear polarizer 635. Thus the light from the micro-mirrors passes through to the camera or eyelens 634, but the extraneous light from source 631 is blocked, providing a high signal-to-noise ratio. From the operator's perspective, this projection eyepiece is identical in operation to that of FIG. 2A. However, it eliminates the problem of maintaining optical alignment of the two physical reticles.

An alternate embodiment of the projection eyepiece of FIG. 6 uses a non-polarizing beam splitter 633. In this alternative embodiment, quarter wave plates 638 and 636 are replaced with a single quarter wave plate located between the beam splitter 633 and relay lens 241. Polarized light from the source 631 is therefore again blocked by polarizer 635 which is oriented to pass light only in the orthogonal direction. However, after making two passes through the quarter wave plate, once down the microscope body and again on its return trip, the reflected light becomes polarized in the orthogonal direction, causing it to pass through polarizer 635 and reaches camera or eyelens 634.

An alternative embodiment replaces collimating lens 631B with a focusing lens and diffuser grating to focus the majority of the light from source 631A onto the reflective portions of reticle 637.

While this description illustrates what are at present considered to be preferred embodiments of the present invention, it will be understood by those skilled in the art that various changes and modifications may be made, and equivalents may be substituted for elements thereof without departing from the true scope of the present invention. For instance, although ideal thin paraxial lenses are shown in the figures, it would be readily apparent to those of skill that this invention is not limited to any particular lens prescription. In addition, many modifications may be made to adapt a particular situation or material to the teaching of the present invention without departing from the central scope thereof. Therefore, the present invention should not be limited to the particular embodiment disclosed as the best mode contemplated for carrying out the present invention. Rather, the present invention is intended to include all embodiments falling within the scope of the appended claims.

Furthermore, the foregoing description and the drawings are regarded by the applicant as including a variety of individually inventive concepts, some of which may lie partially or wholly outside the scope of some or all of the following claims. The fact that the applicant has chosen at the time of filing of the present application to restrict the claimed scope of protection in accordance with the following claims is not to be taken as a disclaimer of alternative inventive concepts that are included in the contents of the application and could be defined by claims differing in scope from the following claims, which different claims may be adopted subsequently during prosecution, for example, for the purposes of a continuation or divisional application.

What is claimed is:

1. A method of detecting alignment between positions on opposing surfaces of a substrate, comprising:

focusing a first image on a first position of a first substrate surface; and determining whether the first position is aligned with a second position on an opposing second substrate surface based on a second image formed based on light from a micro-optical device that is located on the second substrate surface for collecting light from the first image focused thereon.

2. A method recited by claim 1, wherein the micro-optical device is one of a simple concave mirror, a reflective image forming lens, a reflective diffractive optical element, a complex diffraction grating, and a hologram.

3. The method recited by claim 1, wherein a position and appearance of the second image are related to a lateral position of the first image with respect to the micro-optical device.

4. The method recited by claim 1, wherein the determining step includes:

determining that the first and second positions are aligned when an optical axis of the micro-optical device passes through the first position upon which the first image is focused.

5. The method recited by claim 1, wherein the determining step includes:

determining whether the first and second positions are aligned based on a comparison of the second image with the first image.

6. The method recited by claim 1, wherein the determining step includes:

projecting the first image and the second image upon an image plane, and determining whether the first and second positions are aligned based upon a coincidence of the first image and the second image on the image plane.

7. The method recited by claim 6, wherein the determining step further includes:

determining that the first and second positions are aligned when the first and second images coincide on the image plane.

8. The method recited by claim 6, wherein the determining step further includes:

visually comparing the first image with the second image on the image plane.

9. A method of forming patterns on one side of a substrate in alignment with patterns on an opposing side of the substrate, comprising:

determining whether a first position on a first surface of the substrate is aligned with a second position on a second surface of the substrate based on a second image formed from light from a micro-optical device that is located on the second surface for collecting light from a first image focused thereon; and forming marks at the first position on the first surface based on whether the first and second positions are aligned.

10. The method recited by claim 9, wherein the micro-optical device is a mirror located at the second surface that has an optical axis projecting through the second position, and wherein the first image is reflected from the mirror.

11. The method recited by claim 9, wherein the micro-optical device is a diffractive optical element located on the second surface of the substrate, and wherein a reticle image is diffracted from the diffractive optical element on the second surface to form a secondary image on the first surface.

12. The method recited by claim 9, further comprising:
projecting the first image toward the first surface, the light from the first image being incident on the second surface after passing through the first surface.

13. The method recited by claim 9, wherein the determining step comprises:
focusing an image at the first position on the first surface; and
determining whether the first position is aligned with the second position based on at least one of the position and shape of the image produced by the micro-optical device on the second surface.

14. The method recited by claim 10, further comprising:
moving a device used to project the first image relative to the substrate when the first position and second position are not determined to be aligned.

15. The method recited by claim 10, wherein the forming step comprises:
positioning a mask on the first surface when the first position and second position are determined to be aligned; and
forming patterns on the first surface using the mask.

16. The method recited by claim 15, wherein the positioning step comprises:
aligning the mask with the first position before forming the patterns.

17. The method recited by claim 15, wherein the marks are formed on the first surface in alignment with marks on the second substrate surface.

18. A system for detecting alignment of areas on opposing surfaces of a substrate, comprising:
a mask aligner with an eyepiece that projects a first image toward a substrate having first and second opposing surfaces, the projected first image being incident on the first substrate surface and a second image being formed based on light from a micro-optical device that is located on the second substrate surface for collecting light from the first image projected thereon; and
a detector that compares the first image with the second image to determine alignment of the mask aligner with an optical axis of the micro-optical device.

19. The system recited by claim 12, further comprising:
an image plane upon which the first and second images are projected,
wherein the detector determines alignment based upon a coincidence of the first and second images at the image plane.

20. The system recited by claim 19, wherein the detector determines alignment when the first and second images are superimposed at the image plane.

21. The system recited by claim 16, wherein the detector includes:
an optical system used to visually compare the first and second images at the image plane.

22. A system for identifying patterns on one side of a substrate corresponding to patterns on an opposing side of the substrate, comprising:
a detector that determines whether a first position on a first substrate surface is aligned with a second position on a second substrate surface based on a second image formed based on light from a micro-optical device located on the second substrate surface which collects light from a first image focused thereon;
a pattern identifier that identifies patterns on the first substrate surface when the first position and second position are determined to be aligned.

23. The system recited by claim 22, wherein the detector comprises:
focusing optics that focus the first image on the first position on the first substrate surface; and
a detector that determines whether the first position is aligned with the second position based on at least one of the position and shape of the image produced by the micro-optical device on the second substrate surface.

24. The system recited by claim 23, wherein the detector determines whether the first position is aligned with the second position based on a comparison between the first image and the second image produced by the micro-optical device on the second substrate surface.

25. The system recited by claim 24, wherein the detector further comprises:
an image plane upon which the first image and the second image are compared.

26. The system recited by claim 22, wherein the pattern identifier includes:
a mask that is positioned on the first substrate surface in alignment with the first position when the first position and second position are determined to be aligned, the mask being used to identifying patterns on the first substrate surface that are aligned with corresponding patterns on the second substrate surface.

27. An optics device suitable for alignment of features on first and second surfaces of a single substrate, comprising:
a first surface of said substrate having a micromirror positioned thereon; and
a second surface of said substrate through which light is passed before being incident on and reflected from the micromirror on the first substrate surface, wherein aligned points on the first and second surfaces are identified based on the light reflected from the micromirror.

* * * * *